(12) United States Patent
Lee et al.

(10) Patent No.: US 8,165,429 B2
(45) Date of Patent: Apr. 24, 2012

(54) OPTICAL INTERCONNECTION STRUCTURE AND METHOD FOR MANUFACTURING THE SAME

(75) Inventors: Yongtak Lee, Gwangju (KR);
Youngmin Song, Gwangju (KR);
Eunkyeong Min, Gwangju (KR)

(73) Assignee: Gwangju Institute of Science and Technology, Gwangju (KR)

( * ) Notice: Subject to any disclaimer, the term of this patent is extended or adjusted under 35 U.S.C. 154(b) by 459 days.

(21) Appl. No.: 12/430,093

(22) Filed: Apr. 26, 2009

(65) Prior Publication Data
US 2009/0269010 A1 Oct. 29, 2009

(30) Foreign Application Priority Data
Apr. 26, 2008 (KR) .................. 10-2008-0039079

(51) Int. Cl.
*G02B 6/12* (2006.01)
*G02B 6/13* (2006.01)
*G02B 6/42* (2006.01)

(52) U.S. Cl. ............... 385/14; 385/39; 385/51

(58) Field of Classification Search .............. 205/324
See application file for complete search history.

(56) References Cited

U.S. PATENT DOCUMENTS 5,880,525 A * 3/1999 Boudreau et al. ............ 257/752
5,904,983 A * 5/1999 Chan et al. .................... 428/392
2006/0013525 A1* 1/2006 Murayama ..................... 385/15

FOREIGN PATENT DOCUMENTS
JP 62059907 A * 3/1987
* cited by examiner

*Primary Examiner* — Omar Rojas

(57) ABSTRACT

The present invention relates to an optical interconnection structure and a method for manufacturing the same. The present invention provides an optical interconnection structure comprising: a substrate on which a hole penetrating through a predetermined region is formed; and an optical guide member fixed to the inside of the hole of the substrate, wherein the optical guide member and the substrate are fixed by metal oxide. The present invention provides the optical interconnection structure that can facilitate the optical interconnection between the active optoelectronic devices that transmit/receive the optical signals and the optical waveguide, making it possible to enhance heat dissipation efficiency and improve operation speed.

8 Claims, 3 Drawing Sheets

[Fig.1]
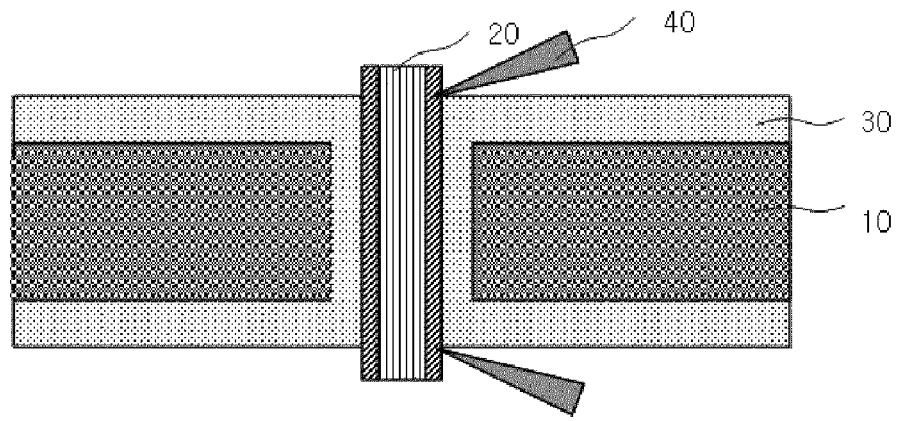
[Fig.2A]
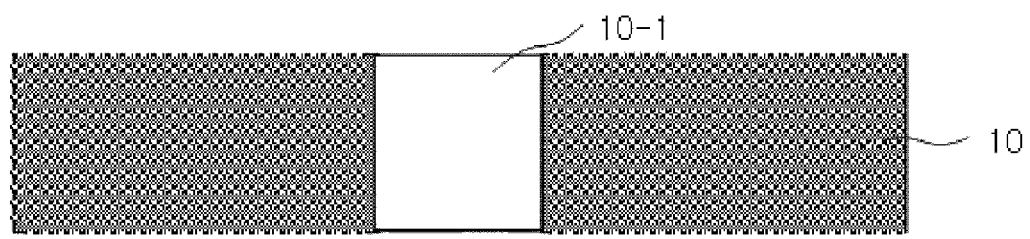
[Fig.2B]
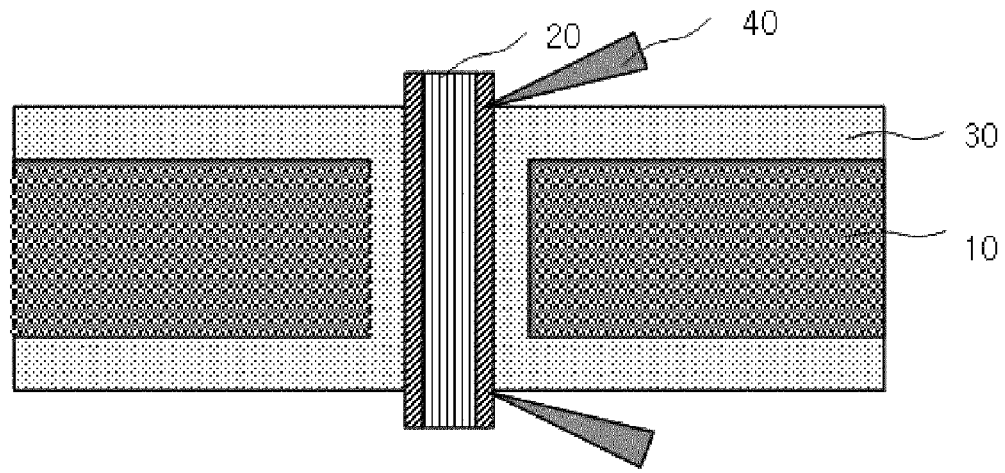

[Fig.2C]
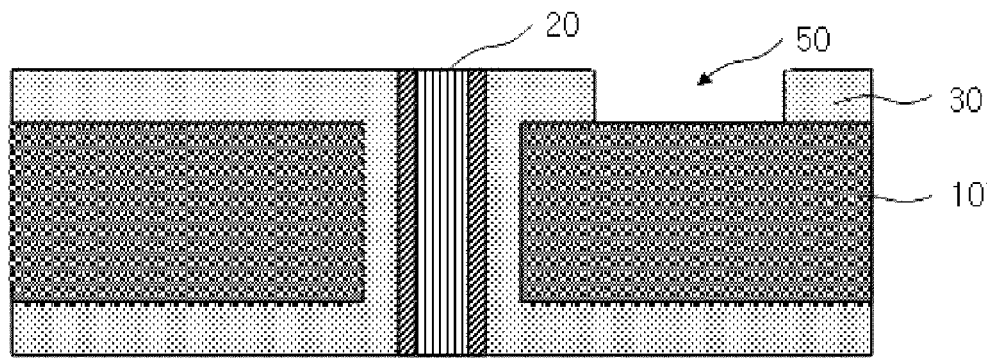
[Fig.2D]
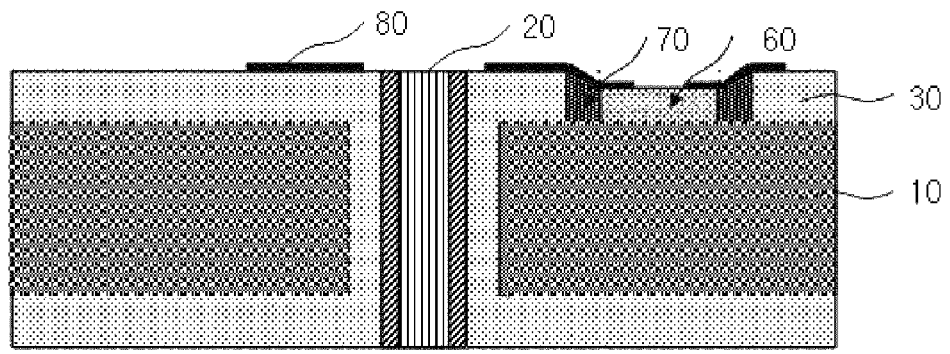
[Fig.2E]
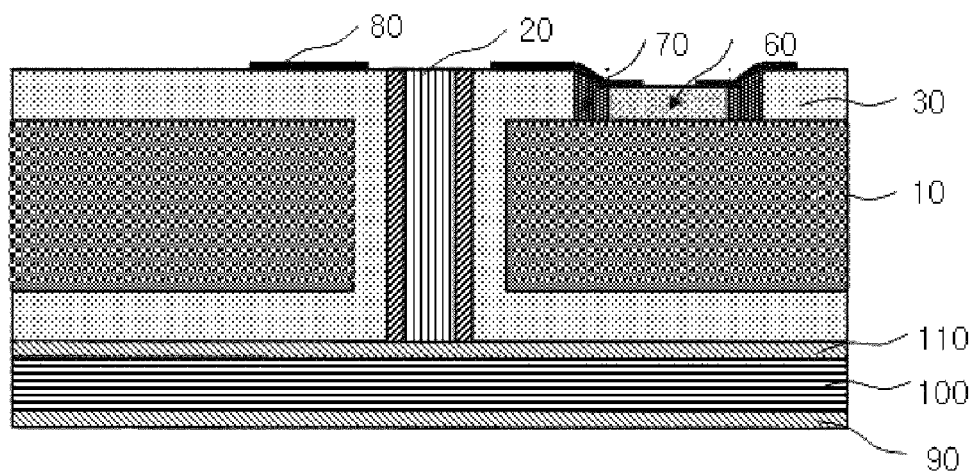

[Fig.2F]
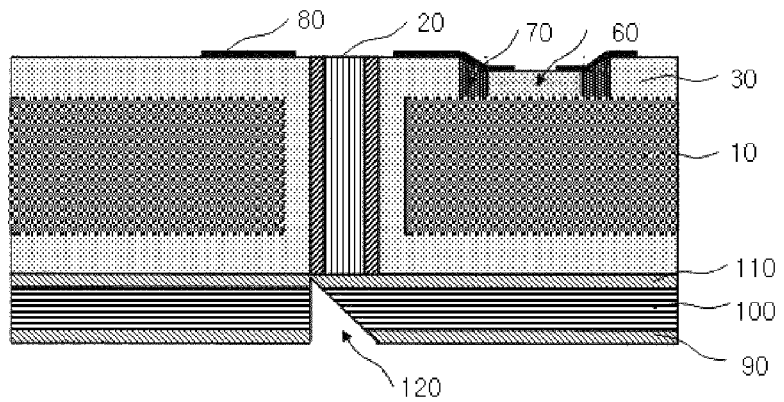
[Fig.2G]
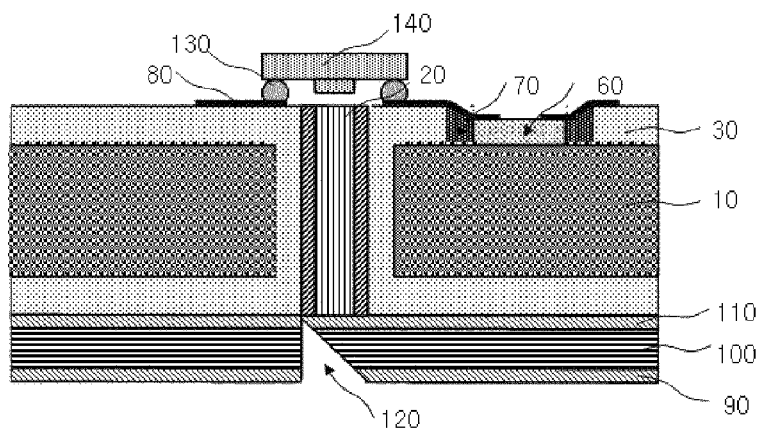
[Fig.2H]
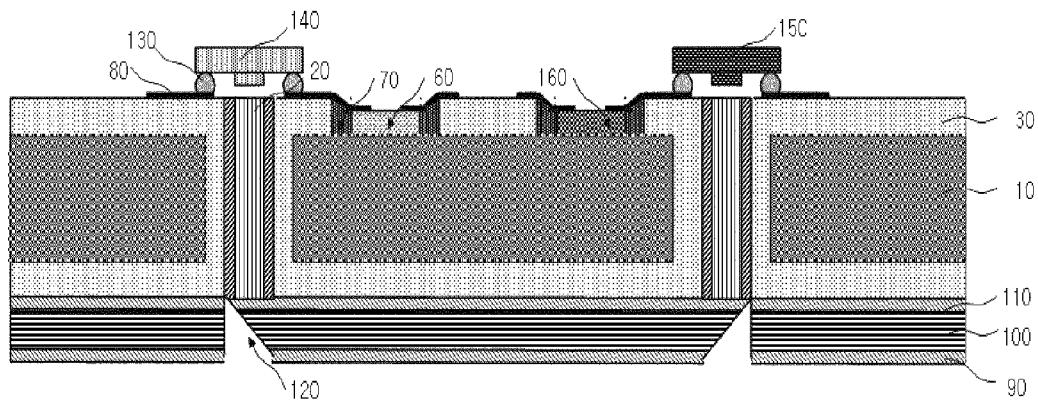

OPTICAL INTERCONNECTION STRUCTURE AND METHOD FOR MANUFACTURING THE SAME

BACKGROUND OF THE INVENTION

1. Field of the Invention

The present invention relates to an optical interconnection structure and a method for manufacturing the same, and more particularly, to an optical interconnection structure that self-aligns optical fibers by anodizing an aluminum substrate and facilitates the optical interconnection between an active optoelectronic device that transmits/receives optical signals and an optical waveguide layer, and a method for manufacturing the same.

2. Description of the Related Art

Generally, an electric interconnection system is limited in high-capacity high-speed transmission due to a limit in transmission speed, high-leakage between electric interconnection and a limit in interconnection density, an electromagnetic interference, etc. Meanwhile, an optical interconnection system has less electromagnetic interference, low power consumption for a long-distance transmission, a wide bandwidth for data transmission, and less interference between signals such that the interconnection density can be increased. Therefore, it is preferable that data is transmitted by applying the optical interconnection in a system that has transmission capacity of several to several hundred Gbps or more.

Several methods are used in an optical interconnection technology, such as optical fiber ribbons, an optical interconnection through free space, a plane optical waveguide, etc., wherein most of the optical interconnection technologies are configured to manufacture the optical interconnection structure by modifying the existing printed circuit board (hereinafter, referred to as a 'PCB').

In this case, most of the optical interconnection technologies use a method that integrates active optoelectronic devices on an optical PCB mounted with a lens or a prism, or integrates optical waveguide or optical fibers on the optical PCB and then, forms a via hole to insert an optical interconnection block or an optical interconnecting rod, etc.

However, problems arise in that since FR4, which is a material used for the optical PCB, has deteriorated thermal characteristics and a high dielectric rate, it is not suitable for a high-speed operation and has difficulty in manufacturing the optical interconnection structure in great quantities.

SUMMARY OF THE INVENTION

In order to solve the above problems, it is an object of the present invention to provide an optical interconnection structure that increases heat dissipation with high thermal conductive characteristics by using a metal substrate (preferably, aluminum substrate) and facilitates a high-speed operation when a low dielectric rate is present and a low insulation loss at high frequencies, and a method for manufacturing the same.

It is another object of the present invention to provide an optical interconnection structure that can be manufactured in great quantities and remarkably improved in view of yield by allowing the semiconductor process at a wafer level to be performed during the processes for forming a via hole for anodizing aluminum, self-aligning of optical fibers, forming a seating groove, forming an optical waveguide, and forming a mirror surface of 45°, and a method for manufacturing the same.

In order to accomplish the objects, according to a first aspect of the present invention, there is provided an optical interconnection structure including: a substrate on which a hole penetrating through a predetermined region is formed; and an optical guide member fixed to the inside of the hole of the substrate, wherein the optical guide member and the substrate are fixed using a metal oxide.

According to a second aspect of the present invention, there is provided a method for manufacturing an optical interconnection structure including: preparing a substrate on which a hole penetrating through a predetermined region is formed, the side wall of the hole being formed with a metal layer; disposing an optical guide member fixed to the inside of the hole of the substrate; and forming a metal oxide by oxidizing the metal layer and then fixing the optical guide member to the substrate using the metal oxide.

According to a third aspect of the present invention, there is provided an optical interconnection structure including: a metal substrate; an optical guide member that is formed to penetrate through a predetermined region of the metal substrate and is fixed by a metal oxidation film formed by the anodization of the metal substrate; and an optical waveguide that is formed on the lower surface of the metal substrate including the oxidation film and is formed by stacking a lower cladding layer, a core layer, and an upper cladding layer.

Preferably, a mirror is further provided in a predetermined region of the optical waveguide corresponding to the optical guide member.

An optical device may further be provided on the upper portion of the optical waveguide member, and a seating groove on which the optical device and interconnections can be seated may further be provided on the upper region of the metal substrate.

According to a fourth aspect of the present invention, there is provided a method for manufacturing an optical interconnection structure including: (a) preparing a metal substrate; (b) forming a hole that perpendicularly penetrates through the metal substrate on a predetermined region of the metal substrate; (c) inserting the optical guide member through a via hole and then forming an oxidation film when the metal substrate is anodized to fix the optical guide member to the inside of the hole; and (d) removing the end of the optical guide member that is protruded into the upper and lower surfaces of the metal substrate including the oxidation film and then sequentially stacking a lower cladding layer, a core layer, and an upper cladding layer on the lower surface of the metal substrate including the oxidation film to form a second optical waveguide.

With the present invention as described above, the optical guide member (for example, optical fibers) is self-aligned by anodizing the aluminum substrate and the optical interconnection between the active optoelectronic devices that transmit/receive the optical signals and the optical waveguide is facilitated, making it possible to enhance heat dissipation efficiency and improve operational speed.

Also, with the present invention, the aluminum substrate is used, making it possible to reduce manufacturing costs of the optical interconnection structure.

Also, with the present invention, the semiconductor process at the wafer level can be performed during the processes for forming a via hole for anodizing aluminum, self-aligning of optical fibers, forming a seating groove, forming an optical waveguide, and forming a mirror surface of 45°, such that the optical interconnection structure can be manufactured in great quantities and remarkably improved in view of yield.

BRIEF DESCRIPTION OF THE DRAWINGS

FIG. 1 is a cross-sectional view explaining an optical interconnection structure according to an embodiment of the present invention; and FIGS. 2A to 2H are cross-sectional views explaining a method for manufacturing an optical interconnection structure according to an embodiment of the present invention.

DETAILED DESCRIPTION OF THE PREFERRED EMBODIMENTS

Hereinafter, the embodiments of the present invention will be described in detail with reference to the accompanying drawings. However, the embodiments of the present invention may be modified in various shapes and the scope of the present invention is not limited to the embodiments set forth below. The embodiments of the present invention are provided for more completely explaining the present invention to those skilled in the art.

FIG. 1 is a cross-sectional view explaining an optical interconnection structure according to an embodiment of the present invention.

The optical interconnection structure of FIG. 1 includes a substrate 10 on which a hole 10-1 penetrating through a predetermined region is formed and an optical guide member 20 fixed to the inside of the hole 10-1 of the substrate 10. The optical guide member 20 and the substrate 10 are fixed by a metal oxide 30.

The substrate 10 preferably includes a metal substrate, however, a portion of the substrate may be formed of metal. In other words, in the present embodiment, the metal inside the hole 10-1 of the substrate 10 becomes oxidized in order to fix the optical guide member 20. When the substrate 10 includes the metal substrate, a metal that is easily oxidized is preferably used. Aluminum, which is easily oxidized, has a relatively simple oxidation process, such that it can be widely used.

A method to form the hole 10-1 on the substrate 10 may be performed in various methods, not limited to a specific method. For example, the hole 10-1 may be formed using a drilling process, or the hole 10-1 may be formed using a laser drilling process, and the hole 10-1 may be manufactured in a circular shape or a rectangular shape, etc. The optical guide member 20 means a structure that guides light, such as optical fibers.

FIGS. 2A to 2H are cross-sectional views explaining a method for manufacturing an optical interconnection structure according to an embodiment of the present invention.

First, referring to FIG. 2A, the hole 10-1 is formed on the metal substrate 10 that is easily oxidized (hereinafter, explained as an aluminum substrate) using a general drilling process.

As shown in FIG. 2B, after inserting the optical fiber 20 into the hole 10-1, the optical fiber 20 is self-aligned by performing the anodization (30) on the aluminum substrate 10 and then the end of the optical fiber is removed by a blade 40. The optical fiber 20 may use material that has low optical loss for light transmission and excellent thermal and chemical stability such as a silica optical fiber, a plastic optical fiber, glass, and plastic material, etc. The aluminum substrate is dipped in an electrolyte solution, for example, sulfuric acid, oxalic acid, chromic acid, phosphoric acid, and boric acid, etc. and then an anode is applied to the aluminum substrate 10 and a cathode is applied to the electrolyte, thereby growing the oxidation layer 30 on the aluminum substrate 10.

Here, a rectifier, which is used for applying an electrode, may use a direct current anodizing, an alternating current anodizing, and a process of superimposed alternating current on direct current, etc. and may control the thickness of the oxidation layer 30 and transparency of the coatings, etc., by controlling the amount of current, the temperature of solution, and the concentration of electrolyte.

Thereafter, as shown in FIG. 2C, a mask pattern (not shown) is formed on the oxidation layer 30 using a lithography process, and the oxidation layer 30 is etched using the mask pattern as a mask, thereby forming a seating groove 50. Here, the etching may be performed to a predetermined depth on the aluminum substrate 10 according to the use, purpose and need, in addition to the oxidation layer 30, and may be etched in any shape that can be made, such as a diamond shape, a rectangular shape, and a polygonal shape, etc.

Thereafter, as shown in FIG. 2D, a laser diode driving driver 60 or a photo diode receiver 150 is adhered or fixed to the etched seating groove 50 using adhesive such as epoxy resin and then, a protective film 70 and an electric interconnection 80 are formed.

The protective film 70 may be formed by applying a liquid-phase polymer membrane over the front surface of the aluminum substrate 10 or the oxidation layer 30 to which the laser diode driving driver 60 or the photo diode receivers 150 are adhered using a spin coating process and then hardening it. The electric interconnection 80 may be constituted of a metal film such as Ti/Au etc.

Thereafter, as shown in FIG. 2E, the lower cladding 90, the core layer 100, and the upper cladding 110 are sequentially stacked in order to form an optical waveguide. At this time, the claddings 90 and 110 and the core layer 100 may include polymer that has low optical waveguide loss on an optical wavelength and excellent thermal and chemical stability, or silica such as amorphous $Si_3N_4$ and $SiO_2$—$TiO_2$, etc. In the case of the polymer, a photolithography method, which is used in a semiconductor process, a RIE method, a molding method, a hot embossing method, a UV patterning method, and a laser direct writing method, etc. may be used. In the case of the silica, an oxidation method, a chemical vapor deposition method, a sputtering method, a flame hydrolysis deposition method, and a Sol-Gel method, etc. may be used.

Thereafter, as shown in FIG. 2F, a mirror 120 of 45° is formed by ways of example. The mirror surface 120 may be formed by a dicing method using a diamond blade, a laser processing method, a wet etching or a dry etching using an etcher, a photolithography method, a hot embossing method, and a molding method, etc., and may be coated by a metal thin film such as Ag, Au, and Al, etc. or a high reflection thin film in order to enhance reflection efficiency.

Thereafter, as shown in FIG. 2G, the laser diode 140 and the photo diode 150, etc. are attached using a solder bump 130, respectively.

Meanwhile, although the specific embodiment is described in the present invention, various modifications can be made in the present invention without departing from the spirit or scope of the invention. Thus, it is intended that the present invention covers the modifications and variations of this invention provided they come within the scope of the appended claims and their equivalents.

What is claimed is:

1. An optical interconnection structure comprising:
    a metal substrate;
    an optical guide member that is formed through which vertically penetrates a predetermined region of the metal substrate and is fixed by a metal oxidation film formed when the metal substrate is anodized; and an optical waveguide that is formed on the lower surface of the metal substrate including the oxidation film and is formed by stacking a lower cladding layer, a core layer, and an upper cladding layer, wherein a seating groove on which an optical device and interconnections can be seated is further provided on an upper portion of the predetermined region of the metal substrate.

2. A method for manufacturing an optical interconnection structure comprising:
 (a) preparing a metal substrate;
 (b) forming a hole that perpendicularly penetrates through the metal substrate on a predetermined region of the metal substrate;
 (c) inserting the optical guide member through the hole and then forming an oxidation film by the anodization of the metal substrate to fix the optical guide member to the inside of the hole; and
 (d) removing the end of the optical guide member that is protruded into the upper and lower surfaces of the metal substrate including the oxidation film and then sequentially stacking a lower cladding layer, a core layer, and an upper cladding layer on the lower surface of the metal substrate including the oxidation film to form an optical waveguide.

3. The method for manufacturing the optical interconnection structure according to claim 2, further comprising:
 forming a mirror on a predetermined region of the optical waveguide corresponding to the optical guide member.

4. The method for manufacturing the optical interconnection structure according to claim 2, wherein in step (c), the oxidation film is formed by dipping the metal substrate in anyone electrolyte solution that is selected from sulfuric acid, oxalic acid, chromic acid, phosphoric acid, and boric acid and then applying an anode to the metal substrate and applying a cathode to the electrolyte.

5. The method for manufacturing the optical interconnection structure according to claim 1, wherein after step (c), further comprising:
 (c-1) forming a mask pattern on the oxidation layer using a lithography process and forming a seating groove by etching the oxidation layer using the mask pattern as a mask so that the metal substrate is exposed;
 (c-2) adhering and fixing an optoelectronic device driving driver or a receiver onto the metal substrate exposed inside the seating groove by adhesives; and
 (c-3) forming a protective film that protects and supports the laser diode driving driver or between the photo diode receivers inside the seating groove.

6. The method for manufacturing the optical interconnection structure according to claim 2, wherein in step (d), the optical waveguide is formed using anyone method selected from a photolithography method, a RIE method, a molding method, a hot embossing method, a UV patterning method, and a laser direct writing method, an oxidation method, a chemical vapor deposition method, a sputtering method, a flame hydrolysis deposition method, and a sol-gel method.

7. The method for manufacturing the optical interconnection structure according to claim 2, wherein in step (e), the mirror is formed using anyone method selected from a dicing method using a diamond blade, a laser processing method, a wet etching or a dry etching, a photolithography method, a hot embossing method, and a molding method.

8. The method for manufacturing the optical interconnection structure according to claim 2, wherein step (e) further comprises coating the reflection surface of the mirror with anyone metal thin film selected from Ag, Au, and AI, or coating it with a high reflection thin film.

* * * * *